(12) United States Patent
Sasaki et al.

(10) Patent No.: US 10,460,947 B2
(45) Date of Patent: Oct. 29, 2019

(54) METHOD FOR POLISHING SILICON WAFER

(71) Applicant: SHIN-ETSU HANDOTAI CO., LTD., Tokyo (JP)

(72) Inventors: Masanao Sasaki, Nishigo-mura (JP); Hiromasa Hashimoto, Nishigo-mura (JP); Kei Fujiyama, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 54 days.

(21) Appl. No.: 15/528,237

(22) PCT Filed: Nov. 25, 2015

(86) PCT No.: PCT/JP2015/005847
§ 371 (c)(1),
(2) Date: May 19, 2017

(87) PCT Pub. No.: WO2016/098286
PCT Pub. Date: Jun. 23, 2016

(65) Prior Publication Data
US 2017/0345662 A1    Nov. 30, 2017

(30) Foreign Application Priority Data
Dec. 15, 2014    (JP) .................. 2014-253069

(51) Int. Cl.
*H01L 21/304*    (2006.01)
*B24B 57/02*    (2006.01)
(Continued)

(52) U.S. Cl.
CPC ........ *H01L 21/304* (2013.01); *B24B 37/0056* (2013.01); *B24B 37/04* (2013.01); *B24B 55/12* (2013.01); *B24B 57/02* (2013.01)

(58) Field of Classification Search
CPC ..... B24B 37/04; B24B 37/0056; B24B 55/12; B24B 57/02; B24B 37/005; B24B 37/044; H01L 21/304
(Continued)

(56) References Cited

U.S. PATENT DOCUMENTS 6,106,728 A * 8/2000 Iida ..................... B24B 57/02
                                                            210/167.3
6,183,352 B1   2/2001 Kurisawa
(Continued)

FOREIGN PATENT DOCUMENTS

CN      1771586 A      5/2006
JP      H04-20742 B2   4/1992
(Continued)

OTHER PUBLICATIONS

English Translation of JP 2008188723 from Espacenet; https://worldwide.espacenet.com.*
(Continued)

*Primary Examiner* — Joseph J Hail
*Assistant Examiner* — Timothy Brian Brady
(74) *Attorney, Agent, or Firm* — Oliff PLC

(57) ABSTRACT

The present invention is method for polishing silicon wafer, the method including recovering used slurry containing polishing abrasive grains that have been supplied to the silicon wafer and used for polishing, and circulating and supplying the recovered used slurry to the silicon wafer to polish the silicon wafer, wherein mixed alkali solution containing chelating agent and either or both of a pH adjuster and a polishing rate accelerator is added to the recovered used slurry without adding unused polishing abrasive grains, and the recovered used slurry is circulated and supplied to the silicon wafer to polish the silicon wafer. As a result, there is provided a method for polishing a silicon
(Continued)

wafer that can suppress the occurrence of metal impurity contamination and stabilize the composition (e.g., the concentration of the chelating agent) of the used slurry when the used slurry is circulated and supplied to the silicon wafer for polishing.

10 Claims, 4 Drawing Sheets

(51) Int. Cl.
*B24B 37/005* (2012.01)
*B24B 37/04* (2012.01)
*B24B 55/12* (2006.01)

(58) Field of Classification Search
USPC .................. 451/36, 37, 41, 60, 87, 446, 447
See application file for complete search history.

(56) References Cited

U.S. PATENT DOCUMENTS

| | | | | |
|---|---|---|---|---|
| 6,527,969 | B1* | 3/2003 | Tanoue | B01D 61/147 216/93 |
| 6,641,463 | B1* | 11/2003 | Molnar | B24B 37/042 451/285 |
| 6,729,941 | B2* | 5/2004 | Ueno | B24B 37/042 257/E21.214 |
| 7,820,051 | B2* | 10/2010 | Fang | C22B 3/42 204/571 |
| 2002/0197935 | A1* | 12/2002 | Mueller | B24B 37/044 451/36 |
| 2003/0109139 | A1* | 6/2003 | Wenski | B24B 37/0056 438/692 |
| 2006/0205325 | A1 | 9/2006 | Abe et al. | |
| 2008/0003925 | A1* | 1/2008 | Fukasawa | C09G 1/02 451/37 |
| 2008/0096474 | A1* | 4/2008 | Kato | B24B 9/065 451/57 |
| 2009/0053981 | A1* | 2/2009 | Kozasa | B24B 37/0056 451/447 |

FOREIGN PATENT DOCUMENTS

| | | | |
|---|---|---|---|
| JP | 2000-71172 | A | 3/2000 |
| JP | 2000-288935 | A | 10/2000 |
| JP | 2008-093811 | A | 4/2008 |
| JP | 2008188723 | A * | 8/2008 |
| JP | 2008188723 | A * | 8/2008 |
| JP | 2009-54629 | A | 3/2009 |
| JP | 2009-255203 | A | 11/2009 |
| JP | 2010-34462 | A | 2/2010 |
| TW | 200918653 | A | 5/2009 |

OTHER PUBLICATIONS

JP-2008188723-A translation, Espacenet website (Year: 2018).*
Dec. 11, 2017 Office Action and Search Report issued in Taiwanese Patent Application No. 104139801.
Feb. 16, 2016 International Search Report issued with International Patent Application No. PCT/JP2015/005847.
Jul. 22, 2019 Office Action issued in Chinese Patent Application No. 201580064050.9.

* cited by examiner

METHOD FOR POLISHING SILICON WAFER

TECHNICAL FIELD

The present invention relates to a polishing process for processing a silicon wafer with a polishing slurry.

BACKGROUND ART

In general, a silicon wafer (hereinafter, also simply referred to as a wafer) with a diameter of 300 mm or more is produced through the following producing processes. First, a silicon ingot is sliced into thin disk-shaped silicon wafers in a slicing process, and the outer region of the wafer obtained in the slicing process is chamfered in a chamfering process to prevent a fracture and a chip in the wafer. Then, the chamfered wafer is flattened in a lapping process, and mechanical damage remaining in the chamfered and lapped wafer is removed in an etching process. Then, the surface of the etched wafer is mirror-polished and flattened in a polishing process, and the polished wafer is cleaned in a cleaning process to remove a polishing slurry and foreign substances attached to the wafer.

The processes described above are only main processes, and other processes such as a heat treatment process and a surface grinding process may be further added or the sequence of processes may be changed. Moreover, the same process may be performed more than once. Then, an inspection or the like is performed, and the silicon wafer is sent to a device production process and an insulator film and a metal wiring line are formed on the surface of the silicon wafer, whereby a device such as a memory is produced.

Besides, the polishing process is generally a process of polishing and flattening the surface of a silicon wafer to a mirror-smooth state by bringing the silicon wafer into sliding contact with a polishing pad while supplying a polishing slurry. In the polishing process of the silicon wafer, usually, polishing is performed in multiple stages from rough polishing to finish polishing. In general, primary polishing is performed by double-side polishing, and then secondary polishing and further finish polishing are performed by single-side polishing to remove damage caused in the primary polishing and improve surface roughness.

In the double-side polishing, the silicon wafer is held in a holding hole of a carrier, and the carrier is interposed between upper and lower turn tables to which polishing pads are attached. Then, both surfaces of the wafer are brought into sliding contact with the polishing pads by rotating the upper and lower turn tables in opposite directions to each other while supplying a polishing slurry to the polishing pads, whereby the surfaces are simultaneously polished (for example, see Patent Document 1). Moreover, the double-side polishing often employs a method in which a plurality of silicon wafers are polished at the same time and the polishing is repeated in a batch manner.

In the single-side polishing, the silicon wafer is held with a polishing head, and one surface of the silicon wafer is brought into sliding contact with a polishing pad attached to a turn table by rotating both the turn table and the polishing head while supplying a polishing slurry to the polishing pad, whereby the surface is polished (for example, see Patent Document 2). The single-side polishing is often employed in the finish polishing process for improving surface roughness of the silicon wafer. The thickness of the silicon wafer to be removed (a polishing stock removal) in this finish polishing process is a little 0.1 µm or less. Moreover, in the finish polishing, disposable slurry is often used for polishing to prevent occurrence of a scratch or the like.

As the slurry used for the above-described polishing of the silicon wafer, a polishing agent in which fine $SiO_2$ (silica) abrasive grains or $CeO_2$ (ceria) abrasive grains are colloidally dispersed in an alkali aqueous solution with a pH of about 9 to 12 is used. Such slurry polishes the silicon wafer by a combination of a mechanical effect of $SiO_2$ or $CeO_2$ and a chemical effect of the alkali aqueous solution to etch silicon. However, silica abrasive grains or ceria abrasive grains contain metal impurities in a trace of amount. Examples of the metal impurities contained in polishing abrasive grains such as silica abrasive grains or ceria abrasive grains include nickel, chromium, iron, and copper.

In particular, metal impurities such as copper and nickel in the silica abrasive grains, which have lower ionization tendency than hydrogen, dissolve as metal ions in the alkali slurry, precipitate on the wafer surface during polishing of the silicon wafer, and deeply diffuse into silicon inside, thus degrading wafer quality and significantly lowering characteristics of a semiconductor device formed by the wafer.

To prevent the degradation of wafer quality due to the slurry containing polishing abrasive grains, for example, a polishing slurry containing highly purified silica abrasive grains is used. However, it is difficult to completely remove metal impurities in the silica abrasive grains. Then, there is disclosed a method in which a water-soluble chelating agent is added to a polishing slurry to trap metal ions by the chelating agent (for example, see Patent Document 3).

Therefore, there is a risk of increasing metal impurities unless the polishing abrasive grains and the water-soluble chelating agent are simultaneously supplied at a constant concentration ratio. Moreover, an amine, which is alkali, is often added as a polishing rate accelerator to the slurry containing polishing abrasive grains in order to improve the polishing rate.

However, since the alkali amine has high silicon etching rate, a remaining amine can locally etch the surface of the silicon wafer after completion of polishing, causing local roughness. This yields inferior products. Thus, after the polishing process with the slurry containing polishing abrasive grains and an alkali amine, post-processing is successively carried out with pure water to prevent the alkali amine from remaining on the surface of the silicon wafer.

In the finish polishing process, disposable polishing slurry is used to prevent occurrence of a scratch or the like, whereas in the polishing process prior to the finish polishing process, the used slurry is recycled to reduce the cost. More specifically, the used slurry is circulated and supplied to the silicon wafer for polishing.

As a technique for recycling the used slurry, for example, Patent Document 4 discloses a polishing slurry recycling apparatus. This polishing slurry recycling apparatus includes a slurry recovering means for recovering a slurry used for polishing, a recovered slurry guiding means for guiding the recovered slurry into a recovering tank, a new slurry supplying means for supplying a new slurry into the recovered slurry, a recycled slurry producing means for mixing the new slurry and the recovered slurry to produce a recycled slurry with a homogeneous concentration, and a measuring means for measuring the concentration of the recycled slurry produced by the recycled slurry producing means.

The new slurry supplying means supplies a new slurry with higher concentration than the recovered slurry and stops supplying the new slurry when the concentration of the recycled slurry measured with the measuring means exceeds a predetermined value of the concentration of the slurry to be supplied. The used slurry is circulated and supplied to the silicon wafer for polishing.

CITATION LIST

Patent Literature

Patent Document 1: Japanese Unexamined Patent publication (Kokai) No. 2010-34462
Patent Document 2: Japanese Unexamined Patent publication (Kokai) No. 2008-93811
Patent Document 3: Japanese Examined Patent publication (Kokai) No. H04-20742
Patent Document 4: Japanese Unexamined Patent publication (Kokai) No. 2000-71172

SUMMARY OF INVENTION

Technical Problem

However, recycling the polishing slurry containing polishing abrasive grains causes more silicon particles occurred by polishing and reaction products such as silicate to flow into the slurry, significantly reducing measurement accuracy of the concentration of the polishing abrasive grains such as silica abrasive grains in the used slurry as well as measurement accuracy of pH. Thus, in the case where components of the recovered used slurry are measured in-line and the measurement result is used for feedback to control the amount of the new slurry and the chemical components to be supplied, it is difficult to accurately keep the composition of the used slurry constant. Especially in a polishing process where a silicon wafer having a diameter of 300 mm or more is polished with a polishing stock removal of more than 0.1 μm, still more silicon particles and reaction products such as silicate flow into the slurry as described above, resulting in a significantly unstable composition of the used slurry.

Moreover, although the alkali amine is often added as a polishing rate accelerator in order to improve the polishing rate, the in-line measurement of the concentration of an amine is difficult.

Moreover, there is a risk of mixing metal impurities in polishing abrasive grains such as silica abrasive grains or ceria abrasive grains as long as a new slurry that is not yet used for polishing is supplied to the recycled slurry. Even if the polishing abrasive grains and the water-soluble chelating agent are simultaneously supplied to the recycled slurry at a constant concentration ratio, there is a risk of elusion of the water-soluble chelating agent, which can effectively react with metal impurities, during the post-processing with pure water just after using the alkali slurry.

The present invention was accomplished in view of the above-described problems. It is an object of the present invention to provide a method for polishing a silicon wafer that can suppress the occurrence of metal impurity contamination and stabilize the composition (e.g., the concentration of the chelating agent) of the used slurry when the used slurry is circulated and supplied to the silicon wafer for polishing.

Solution to Problem

To achieve this object, the present invention provides a method for polishing a silicon wafer, the method comprising: recovering a used slurry containing polishing abrasive grains that have been supplied to the silicon wafer and used for polishing; and circulating and supplying the recovered used slurry to the silicon wafer to polish the silicon wafer, wherein a mixed alkali solution containing a chelating agent and either or both of a pH adjuster and a polishing rate accelerator is added to the recovered used slurry without adding unused polishing abrasive grains, and the recovered used slurry is circulated and supplied to the silicon wafer to polish the silicon wafer.

In the present invention, since unused polishing abrasive grains are not added to the recovered used slurry, metal impurities due to the polishing abrasive grains are not increased. Thus, the occurrence of impurity contamination in the polishing process can be reduced compared with the conventional method. Moreover, adding the mixed alkali solution containing a chelating agent into the recovered used slurry allows the chelating agent in the used slurry to be kept at an appropriate amount, highly maintaining the trapping effect of the chelating agent on metal impurities. Furthermore, since the mixed alkali solution contains either or both of a pH adjuster and a polishing rate accelerator, adding the mixed alkali solution into the used slurry allows adjustment of the polishing rate. Thus, this polishing method enables a desired polishing rate to be achieved. In addition, since additional polishing abrasive grains are not supplied and the metal impurity contamination is reduced, the consumption of the polishing abrasive grains and the chelating agent can be reduced, and the silicon wafer can be polished at low cost.

The pH adjuster may be one or more of KOH, NaOH, TMAH (tetramethylammonium hydroxide), $K_2CO_3$, $Na_2CO_3$, $KHCO_3$, and $NaHCO_3$. The polishing rate accelerator may be an amine. The chelating agent may be a nitrogen-containing compound having a carboxylic acid or a phosphoric acid in its molecule.

As the pH adjuster, the polishing rate accelerator, and the chelating agent, specifically, substances described above can be used.

Additionally, the method preferably further comprises: measuring a concentration of the chelating agent in the recovered used slurry by an absorbance measuring method when the used slurry is circulated and supplied; quantifying the chelating agent in the used slurry based on a result of the measurement; and setting a mixing condition of the chelating agent in the mixed alkali solution based on a result of the quantification such that the concentration of the chelating agent in the used slurry is kept constant.

In this manner, the concentration of the chelating agent can be accurately measured by measuring the concentration of the chelating agent by the absorbance measuring method (a measuring method using absorption photometry). Moreover, setting a mixing condition of the chelating agent in the mixed alkali solution based on such an accurate measurement result enables the concentration of the chelating agent in the used slurry to be kept constant more surely throughout the polishing process.

The method preferably further comprises: regularly monitoring a polishing rate during polishing of the silicon wafer; and setting a mixing condition of either or both of the pH adjuster and the polishing rate accelerator in the mixed alkali solution such that the polishing rate is kept constant.

In this manner, setting a mixing condition of either or both of the pH adjuster and the polishing rate accelerator in the mixed alkali solution based on a result of monitoring the polishing rate enables the polishing rate in the used slurry to be kept constant more surely throughout the polishing process.

In the present invention, the silicon wafer to be polished may have a diameter of 300 mm or more.

The present invention can suppress the impurity contamination and stabilize the composition of the used slurry more surely even in the case of polishing a large-diameter silicon wafer, which is difficult to control the composition of the used slurry.

In the present invention, the silicon wafer may be polished with a polishing stock removal of 0.1 μm or more.

The present invention can suppress the impurity contamination and stabilize the composition of the used slurry more surely even in the case of polishing with a polishing stock removal of 0.1 μm or more, which is difficult to control the composition of the used slurry.

In the present invention, the polishing abrasive grains may be silica abrasive grains.

The present invention is a polishing method suited for the case where silica abrasive grains are used as the polishing abrasive grains.

Advantageous Effects of Invention

The method for polishing a silicon wafer of the present invention can reduce the occurrence of impurity contamination due to the polishing abrasive grains since unused polishing abrasive grains are not added to the used slurry. Moreover, adding the mixed alkali solution containing a chelating agent into the recovered used slurry allows the chelating agent in the used slurry to be kept at an appropriate amount, highly maintaining the trapping effect of the chelating agent on metal impurities. Furthermore, since the mixed alkali solution contains either or both of a pH adjuster and a polishing rate accelerator, adding the mixed alkali solution into the used slurry allows adjustment of the polishing rate. Thus, a desired polishing rate can be achieved. In addition, since additional polishing abrasive grains are not supplied and the metal impurity contamination is reduced, the consumption of the polishing abrasive grains and the chelating agent can be reduced, and the silicon wafer can be polished at low cost.

DESCRIPTION OF EMBODIMENTS

Figure 1:
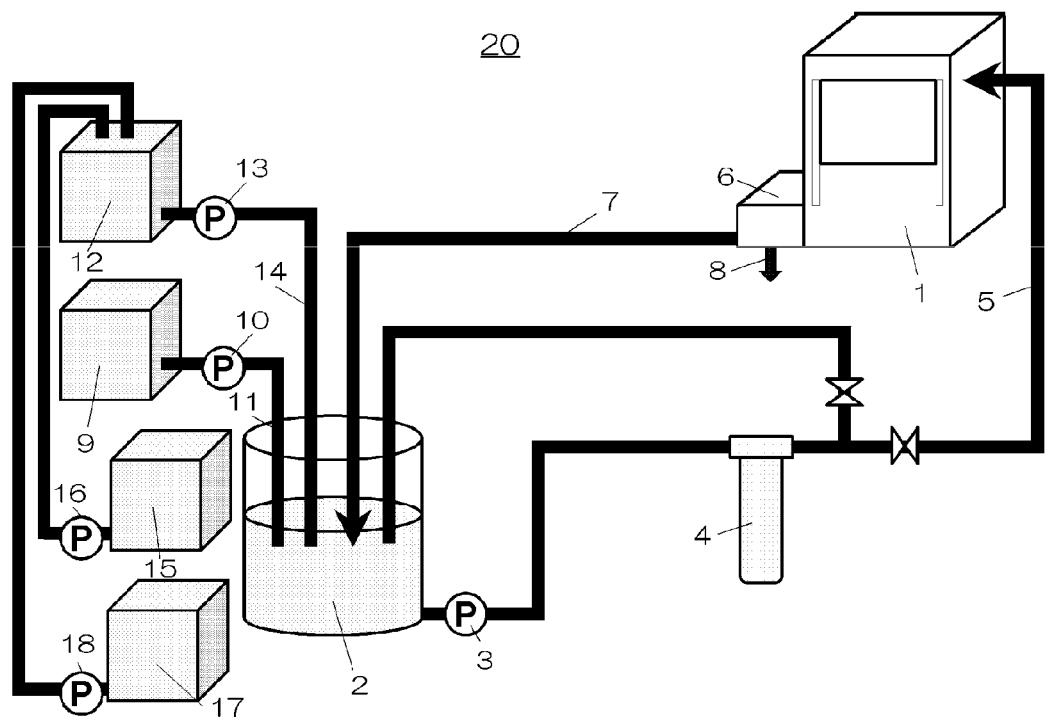
FIG. 1 is a schematic diagram showing an exemplary slurry recycling system usable for the polishing method of the present invention.

Hereinafter, embodiments of the present invention will be described, but the present invention is not limited thereto.

First, a slurry recycling system usable for the polishing method of the present invention will be described with reference to FIG. 1.

A slurry recycling system 20 includes a polishing apparatus 1 for polishing a silicon wafer and a slurry supplying tank 2 for storing a slurry to be supplied to the polishing apparatus 1. The slurry in the slurry supplying tank 2 is supplied to the polishing apparatus 1 through a slurry supplying line 5 by a pump 3. At this time, the slurry may be filtered through a filter 4 and then supplied to the polishing apparatus 1.

The slurry that has been used for polishing in the polishing apparatus 1 is separated by a slurry separator 6 into a drainage line 8 and a slurry recovering line 7 so as to maximize the recovery rate. The slurry recovering line 7 is connected to the slurry supplying tank 2, and the slurry that has been used for polishing (the used slurry) is recovered into the slurry supplying tank 2.

To the slurry supplying tank 2, unused polishing abrasive grains can be supplied from an abrasive grain supplying tank 9 for supplying the unused polishing abrasive grains, by a pump 10. At this time, the unused abrasive grains are supplied through an abrasive grain supplying line 11. In the present invention, the unused polishing abrasive grains are supplied only when an initial slurry (a slurry that is not used for polishing yet) is produced. Thus, the unused polishing abrasive grains are not added to the used slurry recovered after supplying to the polishing apparatus 1.

The slurry supplying tank 2 is connected to a mixed alkali solution supplying tank 12 storing the mixed alkali solution containing a chelating agent and either or both of a pH adjuster and a polishing rate accelerator by a mixed alkali solution supplying line 14. Then, the mixed alkali solution is added to the slurry supplying tank 2 from the mixed alkali solution supplying tank 12 by a pump 13.

The chelating agent is supplied to the mixed alkali solution supplying tank 12 from a chelating agent supplying tank 15 for supplying the chelating agent, by a pump 16. Additionally, the pH adjuster is supplied to the mixed alkali solution supplying tank 12 from a pH adjuster supplying tank 17 for supplying the pH adjuster, by a pump 18.

Although FIG. 1 shows the case where the pH adjuster is mixed to the mixed alkali solution in the mixed alkali solution supplying tank 12 from the pH adjuster supplying tank 17, a polishing rate accelerator supplying tank may be provided instead of the pH adjuster supplying tank 17 to supply the polishing rate accelerator when the polishing rate accelerator is mixed to the mixed alkali solution. Alternatively, when both the pH adjuster and the polishing rate accelerator are mixed to the mixed alkali solution, both the pH adjuster supplying tank and the polishing rate accelerator supplying tank may be provided, or a pH adjuster supplying tank also storing the polishing rate accelerator may be used.

Moreover, the chelating agent with higher concentration than that in the used slurry and either or both of the pH adjuster and the polishing rate accelerator with higher concentration than those in the used slurry are supplied to the slurry supplying tank 2 in order to keep the composition of the used slurry in the slurry supplying tank 2 constant.

Moreover, non-illustrated pure water supplying lines are connected to the abrasive grain supplying tank 9, the mixed alkali solution supplying tank 12, the chelating agent supplying tank 15, and the pH adjuster supplying tank 17 (or the polishing rate accelerator supplying tank). This enables commercially available silica abrasive grains, chelating agent, and pH adjuster (or polishing rate accelerator) to be diluted at appropriate concentrations.

Such a polishing apparatus 1 arranged in the slurry recycling system 20 may be a double-side polishing apparatus or a single-side polishing apparatus. The polishing apparatus is any apparatus capable of polishing with a polishing slurry, and is not limited to a particular apparatus. In the following, main constitutions of the double-side polishing apparatus and the single-side polishing apparatus will be described with reference to FIG. 2 and FIG. 3, respectively.

Figure 2:
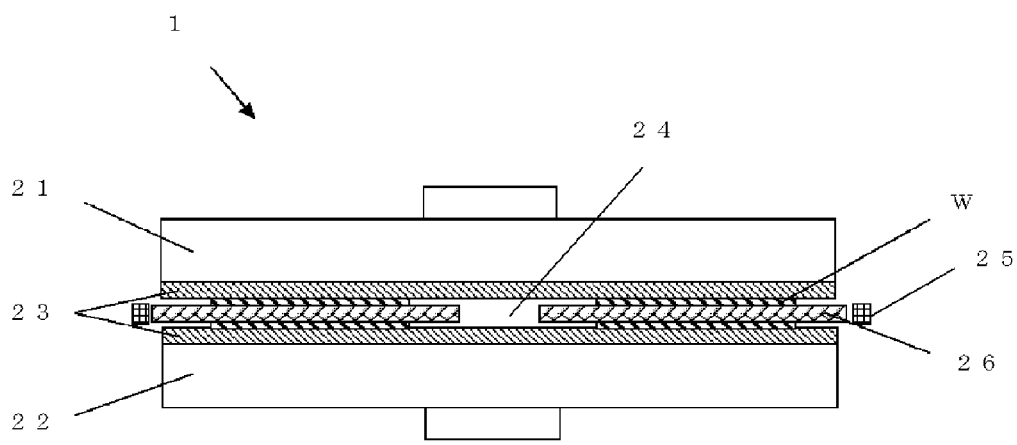
FIG. 2 is a schematic diagram showing an example of a double-side polishing apparatus.

First, as the double-side polishing apparatus that can be used for the polishing apparatus 1, a planetary double-side polishing apparatus shown in FIG. 2 will be described. As shown in FIG. 2, the double-side polishing apparatus includes an upper turn table 21 and a lower turn table 22 that are provided so as to face each other vertically, and a polishing pad 23 is attached to each of the turn tables 21 and 22. A sun gear 24 is provided at the center between the upper turn table 21 and the lower turn table 22, and an internal gear 25 is provided at the outer edge of these tables. A silicon wafer W is held in a holding hole of a carrier 26 and interposed between the upper turn table 21 and the lower turn table 22.

An outer circumferential gear of the carrier 26 engages the respective teeth of the sun gear 24 and the internal gear 25. As the upper turn table 21 and the lower turn table 22 are rotated by a driving source not shown, the carrier 26 revolves around the sun gear 24 while rotating about its own axis. At this time, both surfaces of the silicon wafer W held in the holding hole of the carrier 26 are polished by the upper and lower polishing pads 23 at the same time. Moreover, a slurry is supplied to the silicon wafer W through a nozzle not shown during polishing of the silicon wafer W.

Figure 3:
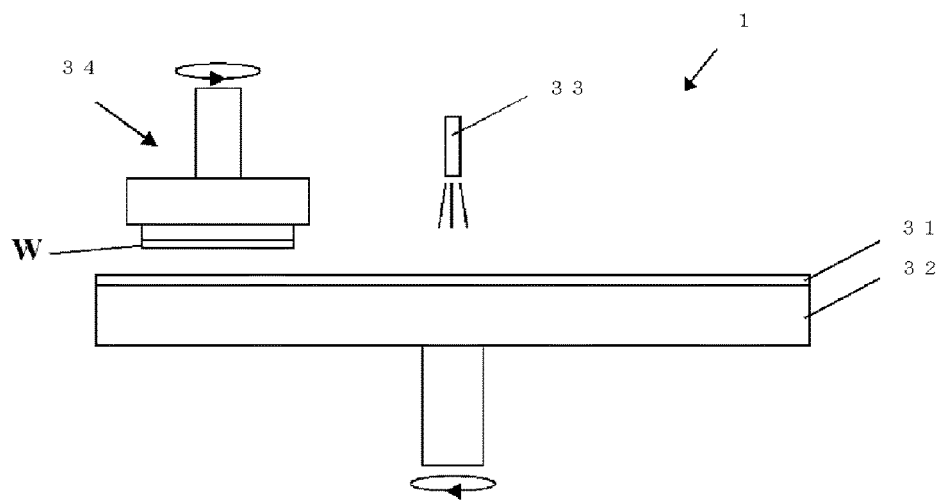
FIG. 3 is a schematic diagram showing an example of a single-side polishing apparatus.

Then, as the single-side polishing apparatus that can be used for the polishing apparatus 1, a single-side polishing apparatus shown in FIG. 3 will be described. As shown in FIG. 3, the single-side polishing apparatus mainly includes a turn table 32 to which a polishing pad 31 is attached, a slurry supplying mechanism 33, and a polishing head 34. In this single-side polishing apparatus, the polishing head 34 holds a silicon wafer W, the slurry supplying mechanism 33 supplies a slurry to the polishing pad 31 and then the silicon wafer W, and the surface of the semiconductor wafer W is brought into sliding contact with the polishing pad 31 by rotating both the turn table 32 and the polishing head 34 to perform single-side polishing.

Next, the method for polishing a silicon wafer of the present invention will be described with reference to the case of using the above-described slurry recycling system 20.

First, an initial slurry is stored in the slurry supplying tank 2. The initial slurry may be produced by mixing the polishing abrasive grains such as silica abrasive grains or ceria abrasive grains, the chelating agent, the pH adjuster, the polishing rate accelerator, and pure water, etc., introduced from the respective tanks.

Then, the produced initial slurry is supplied to a silicon wafer in the polishing apparatus 1 through the slurry supplying line 5 to polish the silicon wafer. As described above, the polishing process may be a double-side polishing process or a single-side polishing process.

Then, a used slurry that has been used for polishing is recovered. At this time, the slurry is separated by the slurry separator 6 into the drainage line 8 and the slurry recovering line 7. The used slurry is then recovered into the slurry supplying tank 2 through the slurry recovering line 7. Thus, in the present invention, the slurry used for polishing the silicon wafer is recovered, and the recovered used slurry is circulated and supplied to the silicon wafer for polishing.

At this time, in the present invention, a mixed alkali solution containing a chelating agent and either or both of a pH adjuster and a polishing rate accelerator is added to the recovered used slurry without adding unused polishing abrasive grains. As described above, an unused slurry containing polishing abrasive grains is conventionally added to the used slurry to adjust the composition of the recovered used slurry. However, since the unused polishing abrasive grains contain many metal impurities compared with the used polishing abrasive grains, there is a problem of increasing metal impurities in the used slurry.

Accordingly, only a mixed alkali solution containing a chelating agent and either or both of a pH adjuster and a polishing rate accelerator is added without adding unused polishing abrasive grains. This allows the composition of the used slurry to be adjusted while suppressing the metal impurity contamination. In addition, since additional polishing abrasive grains are not supplied and the metal impurity contamination is reduced, the consumption of the polishing abrasive grains and the chelating agent can be reduced, and the silicon wafer can be polished at low cost.

Moreover, adding the pH adjuster and the polishing rate accelerator stabilizes the polishing rate and allows a desired processing time to be set.

In the present invention, the pH adjuster may be one or more of KOH, NaOH, TMAH, $K_2CO_3$, $Na_2CO_3$, $KHCO_3$, and $NaHCO_3$. The polishing rate accelerator may be an amine. Illustrative examples thereof include TMAH, piperazine, and N-(2-aminoethyl)ethanol. The chelating agent may be a nitrogen-containing compound having a carboxylic acid or a phosphoric acid in its molecule. Examples of the nitrogen-containing compound having a carboxylic acid in its molecule include DTPA (Diethylene Triamine Pentaacetic Acid). Examples of the nitrogen-containing compound having a phosphoric acid in its molecule include NTA (Nitrilo Triacetic Acid).

The polishing method of the present invention preferably includes: measuring a concentration of the chelating agent in the recovered used slurry by a absorbance measuring method when the used slurry is circulated and supplied (a measuring step); quantifying the chelating agent in the used slurry based on a result of the measurement (a quantifying step); and setting a mixing condition of the chelating agent in the mixed alkali solution based on a result of the quantification such that the concentration of the chelating agent in the used slurry is kept constant (a setting step).

In the measuring step, the concentration of the chelating agent in the recovered used slurry is measured by the absorbance measuring method (a measuring method using absorption photometry). More specifically, first, a part of the recovered used slurry is collected from the slurry supplying tank 2. To the collected part of the used slurry, a metal solution with a known concentration is added to color the slurry. Examples of the metal solution with a known concentration include a solution dissolving copper. Then, the absorbance of the colored used slurry is measured with an absorption photometer to determine the concentration of the chelating agent based on the absorbance.

Then, the quantifying step is performed. In the quantifying step, the chelating agent in the entire used slurry is quantified based on the concentration of the chelating agent in the part of the used slurry, measured in the measuring step.

Then, the setting step is performed. In the setting step, a mixing condition of the chelating agent in the mixed alkali solution is set based on a result of the quantification of the chelating agent in the quantifying step such that the concentration of the chelating agent in the used slurry is kept constant. Examples of the mixing condition to be set include the concentration and the adding amount of the chelating agent added to the mixed alkali solution.

Additionally, the present invention preferably includes: regularly monitoring a polishing rate during polishing of the silicon wafer; and setting a mixing condition of either or both of the pH adjuster and the polishing rate accelerator in the mixed alkali solution such that the polishing rate is kept constant.

In this case, the polishing rate during polishing of the silicon wafer can be easily estimated by measuring a polishing stock removal in the polished silicon wafer and dividing the polishing stock removal by the polishing time. In this manner, polishing can be performed in a desired polishing time by setting the mixing condition of the pH adjuster and the polishing rate accelerator in the mixed alkali solution based on the regularly monitored polishing rate such that the polishing rate is kept constant.

Moreover, in the present invention, the silicon wafer to be polished may have a diameter of 300 mm or more, and the silicon wafer may be polished with a polishing stock removal of 0.1 μm or more. The present invention enables the composition of the used slurry to be kept constant even when more silicon particles caused by polishing and reaction products such as silicate flow into the slurry because of the silicon wafer with large diameter or large polishing stock removal.

EXAMPLE

Hereinafter, the present invention will be more specifically described with reference to an example and a comparative example, but the present invention is not limited to the example.

Example

Both surfaces of silicon wafers were polished by a slurry recycling system 20 as shown in FIG. 1, according to the method for polishing a silicon wafer of the present invention. In this example, a 20B double-side polishing apparatus manufactured by Fujikoshi Machinery Corp., was used as the polishing apparatus 1. A urethane foam pad was used as the polishing pad, and 200 g/cm$^2$ of surface pressure was applied to the silicon wafer during polishing. The polishing amount was 20 μm in total of both surfaces. Under such polishing conditions, five silicon wafers with a diameter of 300 mm were polished in one batch, and 200 polishing batches were successively carried out.

The initial slurry was created in the following manner. First, commercially available high-purified colloidal silica with a primary particle size of 0.035 μm (silica concentration: 20 mass %) was prepared in the polishing abrasive grain supplying tank 9, and diluted with pure water in the slurry supplying tank 2 so as to have a silica concentration of 2%. Moreover, a mixed alkali solution (a mixed solution of DTPA, KOH, and TMAH) was added to the slurry supplying tank 2 such that the chelating agent (DTPA) concentration was 87 ppm and the polishing rate accelerator (TMAH) concentration was 740 ppm in the initial slurry in the slurry supplying tank 2 as well as the initial slurry had a pH of 10.85. Further, a KOH aqueous solution and a TMAH aqueous solution were prepared in the pH adjuster (polishing rate accelerator) supplying tank 17 by using KOH as the pH adjuster and TMAH as the polishing rate accelerator. These pH adjuster and polishing rate accelerator were mixed to the mixed alkali solution, and the mixed alkali solution was added to the slurry supplying tank 2 and adjusted such that the initial slurry had a pH of 10.85. In this manner, silica abrasive grains as the polishing abrasive grains, DTPA as the chelating agent, KOH as the pH adjuster, and TMAH as the polishing rate accelerator were used for the slurry.

A part of the used slurry was collected in every batch and colored by a metal solution with a known Cu concentration to measure the DTPA concentration by absorbance measurement with an absorption photometer U-2001 manufactured by Hitachi, Ltd.

Figure 4:
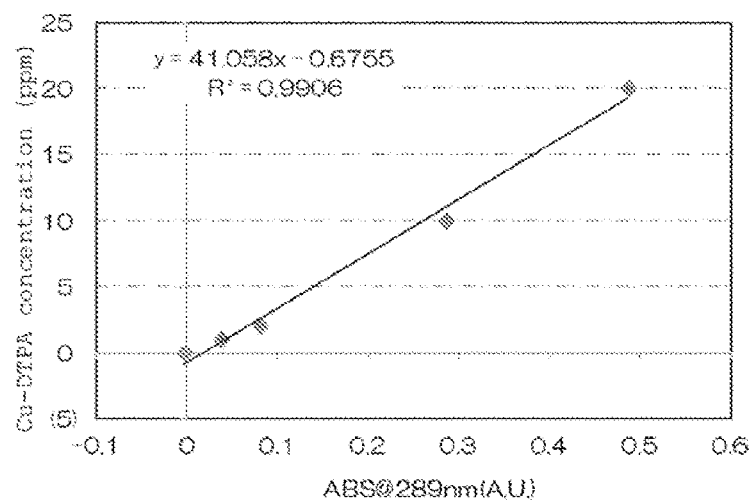
FIG. 4 is a diagram showing a relationship between absorbance and concentration of a Cu-DTPA complex.

FIG. 4 shows a relationship between absorbance (ABS) and concentration of a Cu-DTPA complex at 289 nm wavelength. As shown in FIG. 4, there was a good linear relationship between ABS and concentration of a Cu-DTPA complex, and the DTPA concentration could be accurately determined by this linear calibration curve.

Based on the accurately determined DTPA concentration, the mixing condition of DTPA in the mixed alkali solution was set such that the DTPA concentration in the used slurry during polishing was kept constant.

As the recycled slurry was adjusted to keep the pH at 10.85 while monitoring the pH of the slurry during polishing, an adding condition in the mixed alkali solution was determined such that the polishing rate was made constant as soon as possible while regularly monitoring the silicon polishing rate.

Moreover, 6 cc of the mixed alkali solution (DTPA0.27%/KOH4.7%/TMAH1.5%) alone was added to the used slurry with an interval of 60 seconds during polishing.

In the foregoing manner, both surfaces of the silicon wafers were polished.

As a result, the pH was always kept at 10.85.

Figure 5:
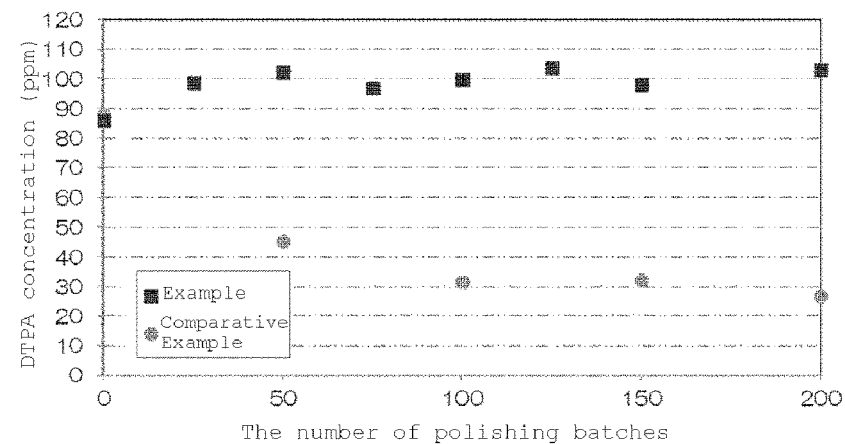
FIG. 5 shows measurement results of DTPA concentration in example and comparative example.

FIG. 5 shows measurement results of the DTPA concentration in the slurry among batches. As shown in FIG. 5, the DTPA concentration was kept between 86 ppm to 104 ppm among 200 successive polishing batches.

Figure 6:
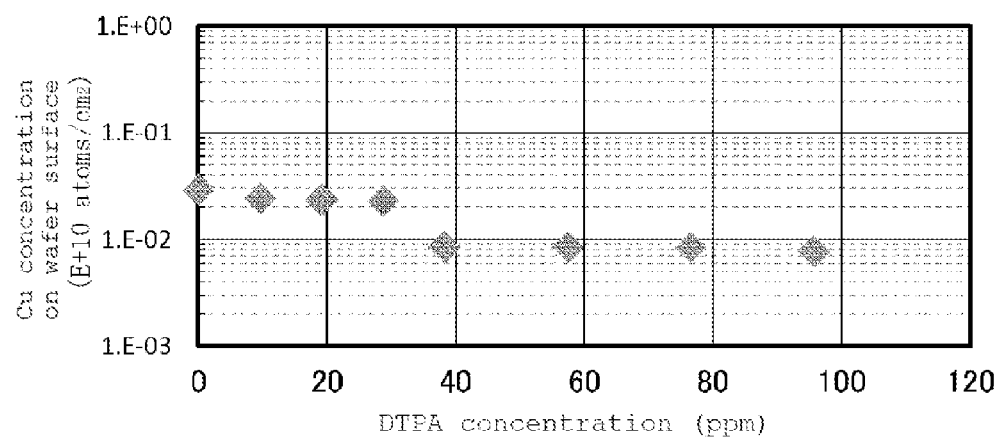
FIG. 6 is a diagram showing a relationship between DTPA concentration and Cu concentration on the surface of a polished silicon wafer in example and comparative example.

To measure impurities on the wafer surface, the surface of the silicon wafer after double-side polishing was scanned with fluonitric acid, and the fluonitric acid used for scanning was measured by commercially available ICP-MS. As a result, when the DTPA concentration was 95.7 ppm, the Cu concentration was 0.009×10$^{10}$ atoms/cm$^2$. FIG. 6 shows a correspondence between the DTPA concentration and the Cu concentration. As shown in FIG. 6, when the DTPA concentration was 95.7 ppm, the Cu concentration was 0.009×10$^{10}$ atoms/cm$^2$, and when the DTPA concentration was higher, the Cu concentration was lower. This indicates that the Cu concentration could be reduced in the DTPA concentration range in Example, and thus the metal impurity contamination could be suppressed.

Figure 7:
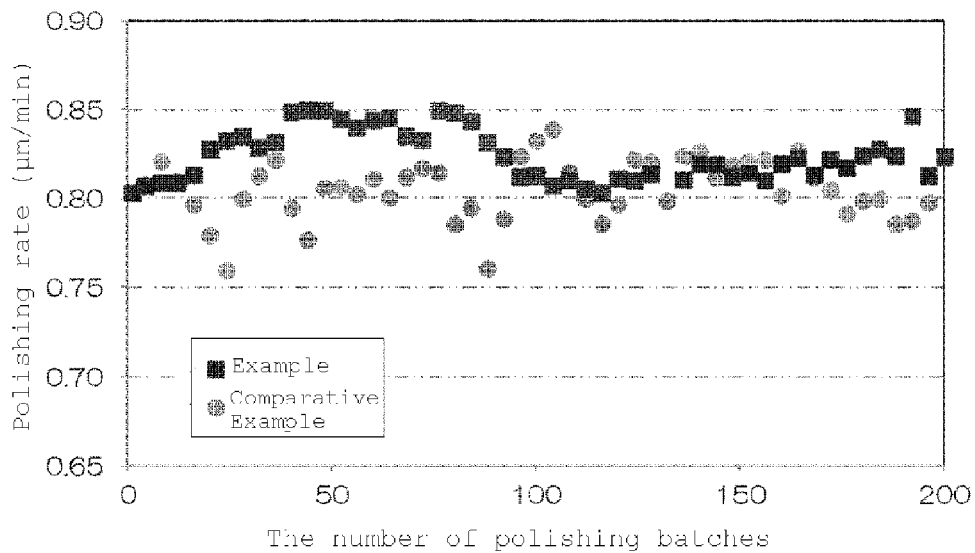
FIG. 7 shows measurement results of polishing rate in example and comparative example.

To measure the polishing rate, the thickness of the wafer before and after polishing was measured with Nanometoro 300TT-A (manufactured by Kuroda precision industries Ltd.). Consequently, as shown in FIG. 7, the rate was 0.80 μm/min to 0.85 μm/min among 200 successive polishing batches. Thus, the polishing rate was stable among the all batches.

Comparative Example

Figure 8:
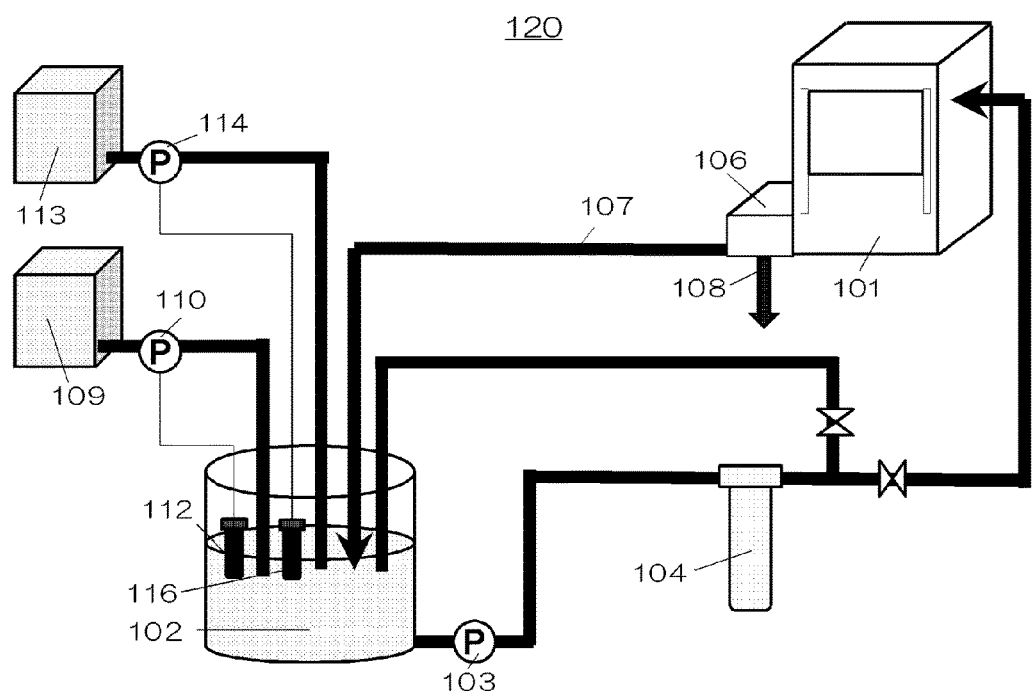
FIG. 8 is a schematic diagram showing a slurry recycling system used in comparative example.

In Comparative Example, double-side polishing was performed while adding unused polishing abrasive grains to a used slurry, like the conventional method. FIG. 8 shows a slurry recycling system used in Comparative Example. As shown in FIG. 8, the slurry recycling system 120 includes a polishing apparatus 101 and a slurry supplying tank 102, and a recycled slurry is filtered through a filter 104 and then supplied to the polishing apparatus 101 by a recycled slurry supplying tank 103. The slurry that has been used for polishing is separated by a slurry separator 106 into a drainage line 108 and a slurry recovering line 107 so as to maximize the recovery rate. The slurry recovering line 107 is connected to the slurry supplying tank 102.

To the slurry supplying tank 102, an unused silica slurry was supplied from a tank 109 for supplying the unused silica slurry to which a chelating agent (DTPA) and a polishing rate accelerator (TMAH) have been added, by an unused silica slurry supplying pump 110. Additionally, a pH adjuster (KOH) was supplied to the slurry supplying tank 102 from a tank 113 for supplying the pH adjuster (KOH), by a pH adjuster supplying pump 114.

Moreover, the silica slurry (containing the chelating agent and the polishing rate accelerator with higher concentration than those in the used slurry) with higher concentration than the used slurry and the pH adjuster were supplied to the slurry supplying tank 102 in order to keep the composition of the slurry in the slurry supplying tank 102 constant. Non-illustrated pure water supplying lines were connected to the unused silica slurry supplying tank 109 and the pH adjuster supplying tank 113 so that the silica slurry and the pH adjuster diluted at appropriate concentrations could be supplied.

The slurry supplying tank 102 was provided with a slurry level gauge (not shown). The slurry recovering rate is not 100%. Thus, when the amount of the recycled slurry fell below a predetermined value, the unused silica slurry supplying pump 110 associated with the slurry level gauge operated such that the unused silica slurry with high concentration was supplied to the slurry supplying tank 102. When the amount of the recycled slurry reached the predetermined value, the unused silica slurry supplying pump 110 stopped.

Moreover, the slurry supplying tank 102 was equipped with a hydrometer 112 as a sensor for measuring the silica concentration. When the specific gravity exceeded a predetermined value, dilution pure water was supplied through a pure water supplying line (not shown) connected to the slurry supplying tank 102 and associated with the sensor for measuring the silica concentration. When the concentration was decreased to the predetermined value or less, supplying of pure water was stopped.

Moreover, the slurry supplying tank 102 was equipped with a pH sensor 116. When the pH fell below a predetermined value, the associated pH adjuster supplying pump 114 operated so that the pH adjuster was supplied from the tank 113 to the slurry supplying tank 102. When the pH reached the predetermined value, the pH adjuster supplying pump 114 stopped.

Double-side polishing was performed with the same double-side polishing apparatus as in Example, under the same polishing conditions as in Example. The composition of the initial polishing slurry was adjusted in the following manner.

20% of commercially available high-purified colloidal silica with a primary particle size of 0.035 µm (W/W) to which the chelating agent DTPA and the polishing rate accelerator TMAH have been added was prepared in the unused silica slurry supplying tank 109, and diluted with pure water in the slurry supplying tank 102 so as to be 2%. At this time, the initial chelating agent DTPA concentration was 87 ppm, and the initial polishing rate accelerator TMAH concentration was 740 ppm.

5% of the pH adjuster KOH was prepared in the supplying tank 113, and the slurry was adjusted so as to have a pH of 10.85 as measured with the pH sensor 116 of the slurry supplying tank 102. Thus, the composition at the time of producing the initial slurry was the same as in Example.

In Comparative Example, an unused silica slurry was supplied from the unused silica slurry supplying tank 109 to the slurry supplying tank 102 such that the silica concentration was 2% as measured with the hydrometer 112. At the same time, 5% KOH was supplied from the supplying tank 113 to the slurry supplying tank 102 such that the pH was 10.85 as measured with the pH sensor 116.

In the foregoing manner, double-side polishing was performed. As shown in FIG. 5, the DTPA concentration in the slurry was 27 ppm to 88 ppm among 200 polishing batches, and the DTPA concentration was decreased with the progress of polishing.

In addition, the concentration of impurities on the wafer surface was measured as in Example. The results are shown in FIG. 6. In Comparative Example, the DTPA concentration was 30 ppm or less, and the Cu concentration was $0.023 \times 10^{10}$ atoms/cm$^2$ or more. These results are worse than in Example.

As shown in FIG. 7, the polishing rate was 0.76 µm/min to 0.83 µm/min. The polishing rate varied more than that in Example, and the polishing rate itself was low.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for polishing a silicon wafer, the method comprising:
   recovering a used slurry containing polishing abrasive grains and obtained from a slurry that had been supplied to the silicon wafer and used for polishing; and
   circulating and supplying the recovered used slurry to the silicon wafer to polish the silicon wafer, wherein
   a mixed alkali solution containing
      a chelating agent and
      either or both of a pH adjuster and a polishing rate accelerator is added to the recovered used slurry without adding unused polishing abrasive grains, and the recovered used slurry is circulated and supplied to the silicon wafer to polish the silicon wafer,
   and further comprising:
   measuring a concentration of the chelating agent in the recovered used slurry by an absorbance measuring method when the used slurry is circulated and supplied;
   quantifying the chelating agent in the used slurry based on a result of the measurement; and
   setting a mixing condition of the chelating agent in the mixed alkali solution based on a result of the quantification such that the concentration of the chelating agent in the used slurry is kept constant.

2. The method for polishing a silicon wafer according to claim 1, wherein the pH adjuster is one or more of KOH, NaOH, TMAH, $K_2CO_3$, $Na_2CO_3$, $KHCO_3$, and $NaHCO_3$, and/or
   the polishing rate accelerator is an amine, and
   the chelating agent is a nitrogen-containing compound having a carboxylic acid or a phosphoric acid in its molecule.

3. The method for polishing a silicon wafer according to claim 2, wherein the silicon wafer to be polished has a diameter of 300 mm or more.

4. The method for polishing a silicon wafer according to claim 2, further comprising:
   regularly monitoring a polishing rate during polishing of the silicon wafer; and
   setting a mixing condition of either or both of the pH adjuster and the polishing rate accelerator in the mixed alkali solution such that the polishing rate is kept constant.

5. The method for polishing a silicon wafer according to claim 4, wherein the silicon wafer to be polished has a diameter of 300 mm or more.

6. The method for polishing a silicon wafer according to claim 1, further comprising:
   regularly monitoring a polishing rate during polishing of the silicon wafer; and
   setting a mixing condition of either or both of the pH adjuster and the polishing rate accelerator in the mixed alkali solution such that the polishing rate is kept constant.

7. The method for polishing a silicon wafer according to claim 6, wherein the silicon wafer to be polished has a diameter of 300 mm or more.

8. The method for polishing a silicon wafer according to claim 1, wherein the silicon wafer to be polished has a diameter of 300 mm or more.

9. The method for polishing a silicon wafer according to claim 1, wherein the silicon wafer is polished with a polishing stock removal of 0.1 μm or more.

10. The method for polishing a silicon wafer according to claim 1, wherein the polishing abrasive grains are silica abrasive grains.

* * * * *